(12) United States Patent
Muta et al.

(10) Patent No.: US 6,798,719 B1
(45) Date of Patent: Sep. 28, 2004

(54) ELECTRONIC DEVICE INCLUDING WARRANTY START DATE

(75) Inventors: Walter J Muta, Santa Clara, CA (US); Thomas M Tripp, El Dorado Hills, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 473 days.

(21) Appl. No.: 09/642,393

(22) Filed: Aug. 18, 2000

(51) Int. Cl.$^7$ .............................................. G06F 17/60
(52) U.S. Cl. .......................................... 368/29; 705/7
(58) Field of Search ............................................ 7/1, 7

(56) References Cited

U.S. PATENT DOCUMENTS

| | | | | |
|---|---|---|---|---|
| 5,031,161 A | * | 7/1991 | Kendrick | 368/280 |
| 5,600,766 A | * | 2/1997 | Deckys et al. | 395/135 |
| 5,971,277 A | * | 10/1999 | Cragun et al. | 235/462.01 |
| 6,023,509 A | * | 2/2000 | Herbert et al. | 380/25 |
| 6,069,848 A | * | 5/2000 | McDonald et al. | 368/107 |
| 6,400,603 B1 | * | 6/2002 | Blyth et al. | 365/185.12 |

FOREIGN PATENT DOCUMENTS

| | | | |
|---|---|---|---|
| JP | 10-143441 | * | 5/1998 |

OTHER PUBLICATIONS

Catalyst Semiconductor CEO Talks to the Wall Street Transcript, Jul. 1999, Business Wire p 2139.*
Malcom McClure, May 1994, Cahners Publishing Co.,EDN, v39,n11,P125 (3).*
Smart Batteries, by Geoff Lewis, May 1996, Electronics World, v.102,p374–375, entire document.*

* cited by examiner

*Primary Examiner*—John G. Weiss
*Assistant Examiner*—Michael J. Fisher
(74) *Attorney, Agent, or Firm*—Timothy F. Myers (57) ABSTRACT

An electronic device has a central processing unit (CPU), a display, and a memory device. The display and memory device are both coupled to the CPU. The memory device includes a data structure having a born-on-date (BOD) field and a counter field. The BOD field contains a warranty start date for the electronic device. The CPU is capable of displaying the BOD field on the display. The BOD field is updated by said CPU based on the contents of said counter field.

20 Claims, 7 Drawing Sheets

ELECTRONIC DEVICE INCLUDING WARRANTY START DATE

FIELD OF THE INVENTION

The invention is related to warranty determination for electronic devices. More specifically, the invention relates to creating and displaying a service ID, which encodes a warranty start date.

BACKGROUND OF THE INVENTION

Since the early 1980's, personal electronic devices such as desktop personal computers, portable computers, personal data assistants, printers, and fax machines, to name a few, have become common place and are now used daily by many people. Although these devices are generally very reliable, sometimes they fail to operate correctly and need to be serviced or repaired. Because these devices are very complex, it is often very difficult to troubleshoot, debug, and repair the exact component failure. Therefore, most of these electronic devices are repaired using board or unit replacement of several of the components. This type of repair when the product is out of warranty, although predictable, can be expensive to a consumer. If the customer insists that a defective product is still under warranty but is unable to show physical proof, many manufacturers will usually absorb the cost of the repair to keep customers satisfied. Other companies will resort to a database of warranty cards and/or manufacturing dates. However, even resorting to databases of warranty cards and/or manufacturing dates presents problems. Often times, the databases have proven to be up to 50% inaccurate due to several factors. Further, because of varying inventory shelf times for different types of selling channels, it is difficult to use the manufacturing date of the product as an estimate of the purchase date.

Often times, electronic devices, such as portable computers, are distributed to users within a corporation from a common pool. Therefore, when a product fails it is often difficult to determine when the warranty period actually began. Therefore, there is also a need to allow customers of electronic devices to determine the start of the warranty period to decide whether a defective unit should be sent to the manufacturer for repair/service or exchanged with another unit from the common pool.

Repairing 'out-of-warranty' electronic devices increases the warranty costs associated with a product and thus affects the profitability of manufacturers. Up to 20% of some systems are returned for repair outside of their warranty period and are accepted at no cost to the customer because there is no accurate way to determine when the electronic device was placed in service. Thus, there is an incentive for manufacturers to accurately determine when a warranty period for a product begins. By eliminating the inability to determine when an electronic device is out of warranty, the cost of warranty repairs will decrease allowing for larger profits or lower cost products.

SUMMARY

An electronic device has a central processing unit (CPU), a display, and a memory device. The display and memory device are both coupled to the CPU. The memory device includes a data structure having a born-on-date (BOD) field and a counter field. The BOD field contains a warranty start date for the electronic device. The CPU is capable of displaying the BOD field on the display. The BOD field is updated by said CPU based on the contents of said counter field.

DETAILED DESCRIPTION OF THE PREFERRED AND ALTERNATE EMBODIMENTS

The invention resolves the issue of when warranty begins by generating and saving a "born-on-date" to non-volatile memory within the electronic device. Further, the user can access the born-on-date through various system utilities or optionally, the electronic device can display the born-on-date such as when restarting or "booting" of the device.

When an electronic device is manufactured, the born-on-date field in the non-volatile memory is initialized along with a counter field. The born-on-date field may be initialized to either a default date based on when the product was manufactured with an allowance for inventory time or some predetermined value which indicates that the born-on-date has not yet been set. The counter field is used to count the number of times an event occurs such as when the electronic device has been turned on, restarted, or booted up to a pre-determined value, preferably 5 times for a portable computer. Further, the electronic device's real-time-clock (RTC) circuit, which includes time and date fields, is preferably set by the manufacturer during production to reflect the date of manufacture. When the counter field has been incremented to the pre-determined value, the RTC circuit is read to retrieve the current date field and the read date field is encoded and formatted before being placed in the born-on-date field. By programming an electronic date into non-volatile memory (nv-memory) on the electronic device based on the occurrence of a number of events, an accurate method to determine the start of the warranty period is achieved.

This "born-on-date", an estimate of a proof of purchase date, is programmed soon after the electronic device is placed in service, for example, such as when a customer powers on the device for the fifth time. Further, by allowing users to access a preferably encoded born-on-date, customers can provide this information to the manufacturer's repair center to determine the warranty period without having to search for receipts, proof of purchase labels, or copies of warranty registration cards.

More details of the invention will become apparent in the following detailed description of the preferred and alternative embodiments.

Figure 1A:
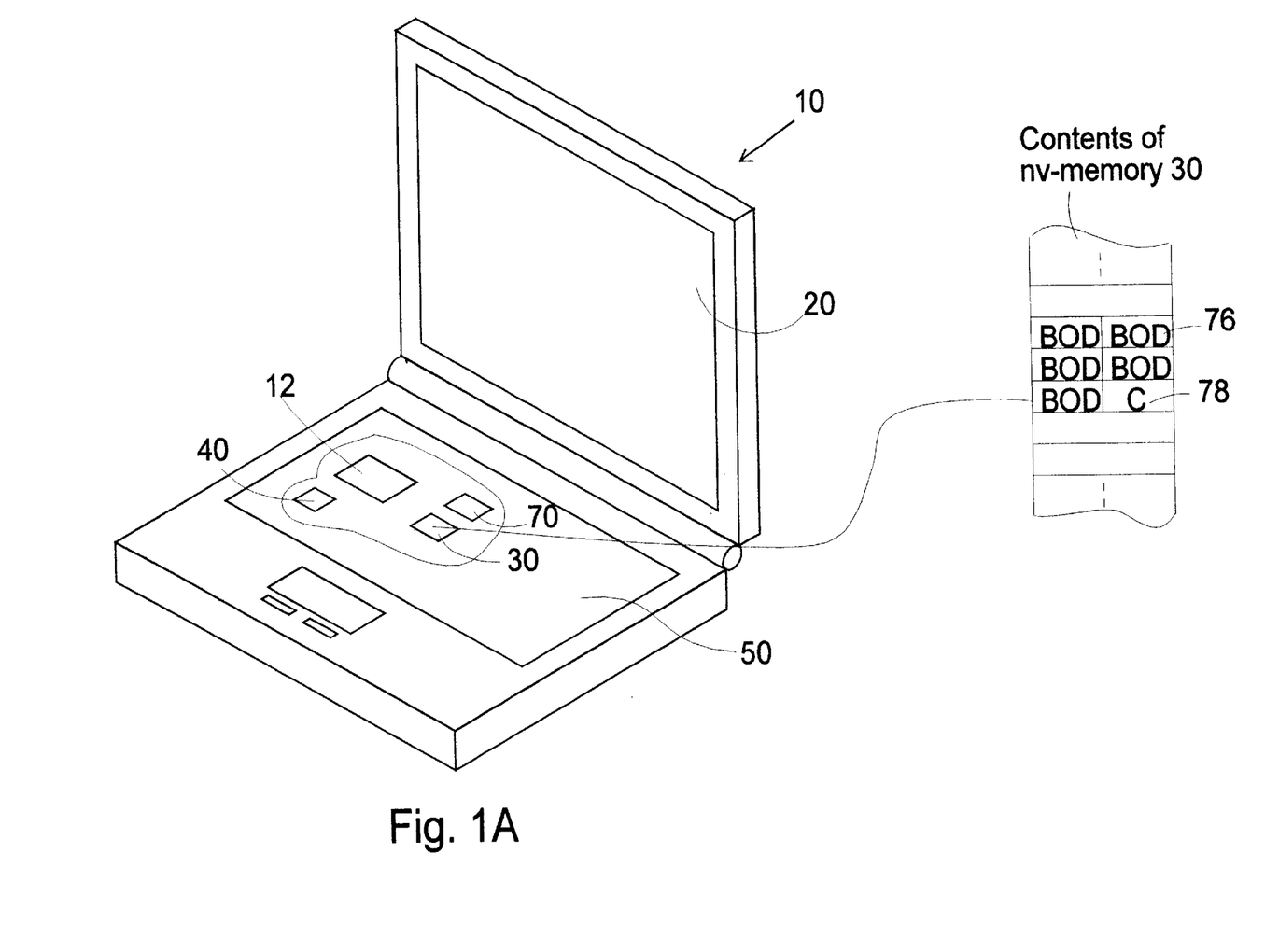
FIG. 1A is an exemplary illustration of an electronic device, here represented as a portable computer, which incorporates the invention.

FIG. 1A is an illustration of an exemplary electronic device, a portable computer 10. The portable computer 10 includes a central processing unit (CPU) 12, a display 20, a real-time-clock (RTC) 70, a memory, preferably a non-volatile type (nv-memory 30) such as a serial electrically erasable programmable read only memory (EEPROM) or flash memory circuit although standard memory such as SRAM or DRAM that has battery back-up would meet the spirit and scope of the invention, a BIOS 40 (basic input/output system software routine) stored in computer readable memory, and a keyboard 50. The nv-memory 30 is organized in a data structure to include a born-on-date (BOD) field 76 and a counter field 78. In the exemplary preferred embodiment for portable computer 10, software routines to provide the BOD are included in the BIOS 40. The BOD field 76 is stored and read from nv-memory 30. When created, the BOD is encoded and formatted using the date read from the RTC 70.

Figure 1B:
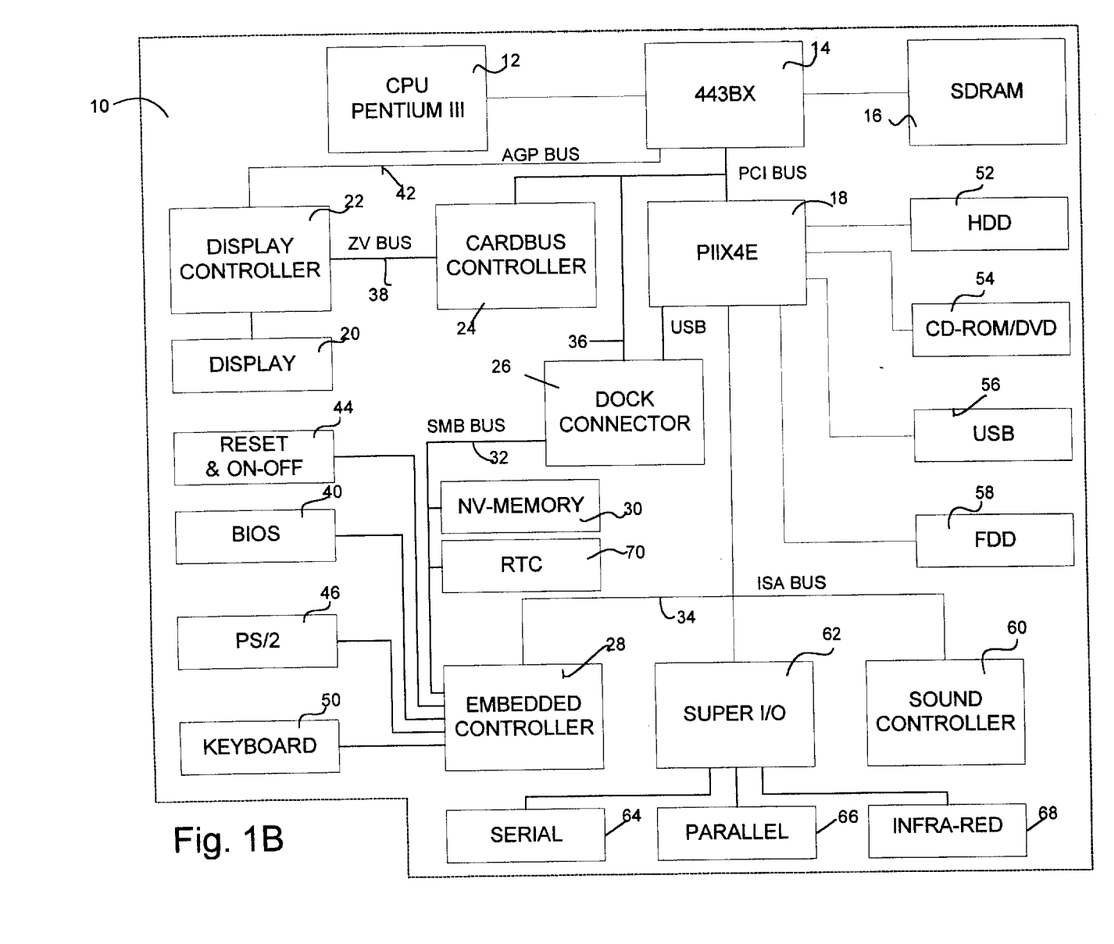
FIG. 1B is an exemplary block diagram of the portable computer in FIG. 1A.

FIG. 1B is an exemplary block diagram of a contemporary portable computer 10 that implements the invention. CPU 12 is preferably a Pentium III processor made by Intel or another compatible processor although any general processor used for an electronic device would meet the spirit and scope of the invention. The CPU 12 is coupled to a memory and I/O controller, represented here as a northbridge integrated circuit (IC), a 443BX 14 also manufactured by Intel. The 443BX 14 interfaces the CPU 12 with system memory, such as SDRAM 16, and various input/output (I/O) devices such as display controller 22, cardbus controller 24, dock connector 26 and southbridge I/O controller, PIIX4E 18. The display controller 18 controls display 20 and allows for direct input from cardbus controller 24 over Zoom Video (ZV) bus 38. The card bus controller 24 allows the portable computer to be expanded with various I/O cards such as PC Card modems, network cards, disk drives, and flash cards, to name a few. Further, other external I/O devices can be interfaced to the portable computer 10 using the dock connector 26. Internal and common I/O devices are interfaced to CPU 12 using the PIIX4E 18 southbridge IC by Intel. The PIIX4E 18 provides several industry standard interfaces to common peripherals such as hard disk drives (HDD) 52, CD-ROM or DVD drives 54, floppy disk drives (FDD) 58, PC compatible ISA bus 34 components and Universal Serial Bus (USB) 56 peripherals. The PC compatible ISA bus 34 components include a sound controller 60, an embedded controller 28, and a superI/O IC 62, which provides serial 64, parallel 66, and infra-red 68 ports. The embedded controller 28 controls and interfaces to the CPU 12 the keyboard 50, PS/2 devices 46, such as mice and external keyboards, reset and on/off circuitry 44 and System Management Bus (SMB) 32 peripherals. The SMB 32 peripherals include, real time clock 70, nv-memory 30, and other devices not shown such as batteries, battery chargers, and dock accessories. The nv-memory 30 is preferably an EEPROM IC or flash device that is either a separate IC or incorporated/integrated into another IC such as the RTC 70. Further, the nv-memory 30 may be located on other bus interfaces than the SMB bus 32 without departing from the spirit and scope of the invention. The nv-memory 30 needs only to be accessible by the CPU 12 so that the BOD can be created, read and viewed on the display 20 or communicated to another computer using a remote diagnostic programs or utilities.

Figure 2A:
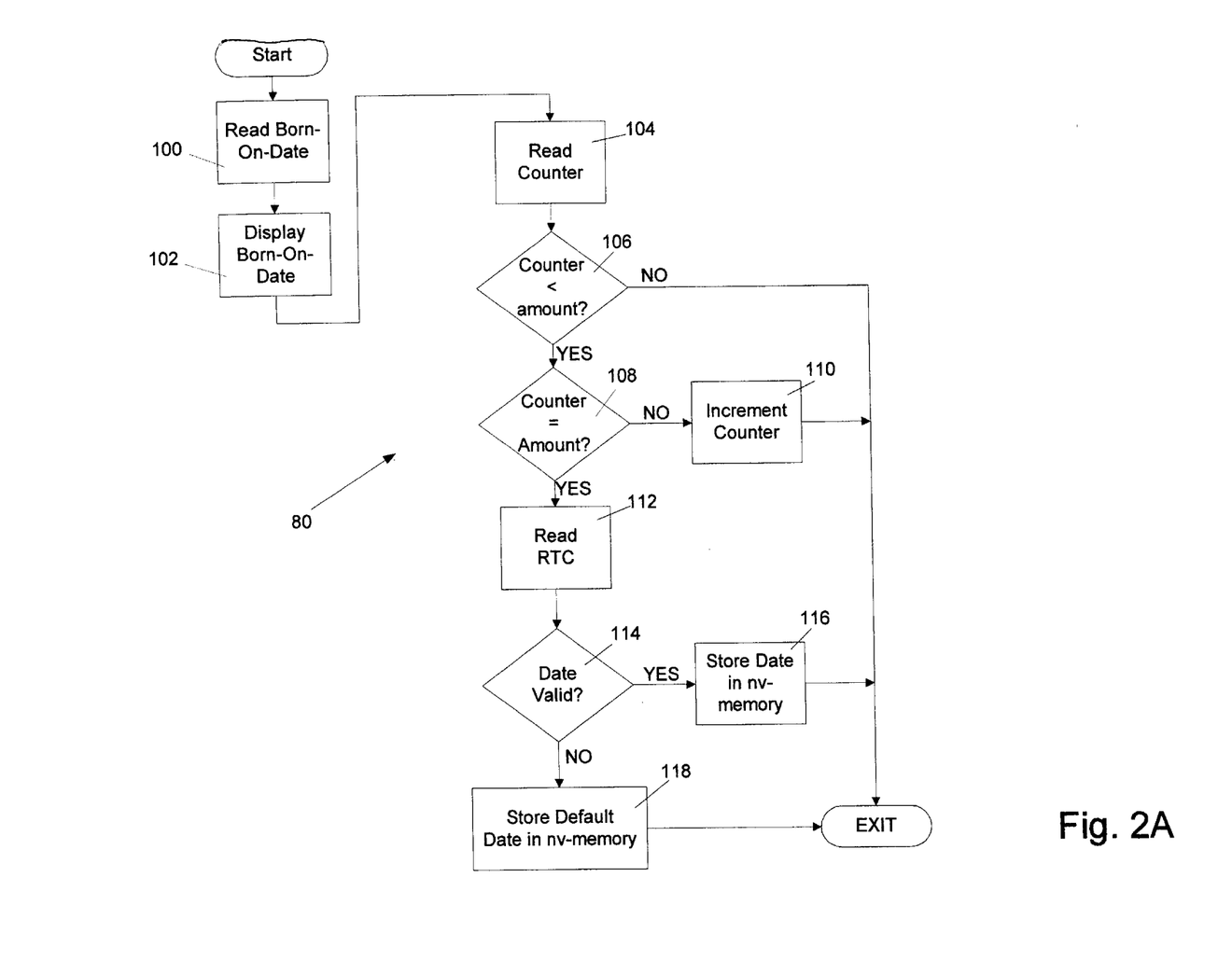
FIG. 2A is an exemplary flow chart of a process implementing at least one aspect of the invention.

FIG. 2A is an exemplary flow chart of a routine to update and display the BOD that is executed out of computer readable memory and preferably located in BIOS 40 as a subroutine. The method of creating and displaying a born-on-date 80 is executed preferably during the power-on self test (POST) routine of the BIOS 30 when portable computer 10 is restarted and booted. In block 100, CPU 12 reads the contents of the BOD from nv-memory 30. The read BOD is encoded and formatted to be shown on display 20 in block 102. The CPU 12 then in block 104 reads the counter field 78 from nv-memory 30. In block 106, if the counter field 78 is less than a pre-determined amount, flow continues to block 108, else the routine just exits. In block 108, if the counter is not equal to the pre-determined amount, the counter is incremented in block 110 and the subroutine exited. If the counter contains the pre-determined amount, then in block 112, the CPU 12 reads the RTC 70 and in block 114 verifies that the date read is a valid date. If the date is valid, then the date is formatted and stored in the BOD field 76 in nv-memory 30 in block 116. If the date is invalid, due to battery failure, defective IC, or tampering, then a default date, preferably derived from a serial number that incorporates the date of manufacturing, is stored in the nv-memory 30 in block 118.

Figures 2B, 2C:
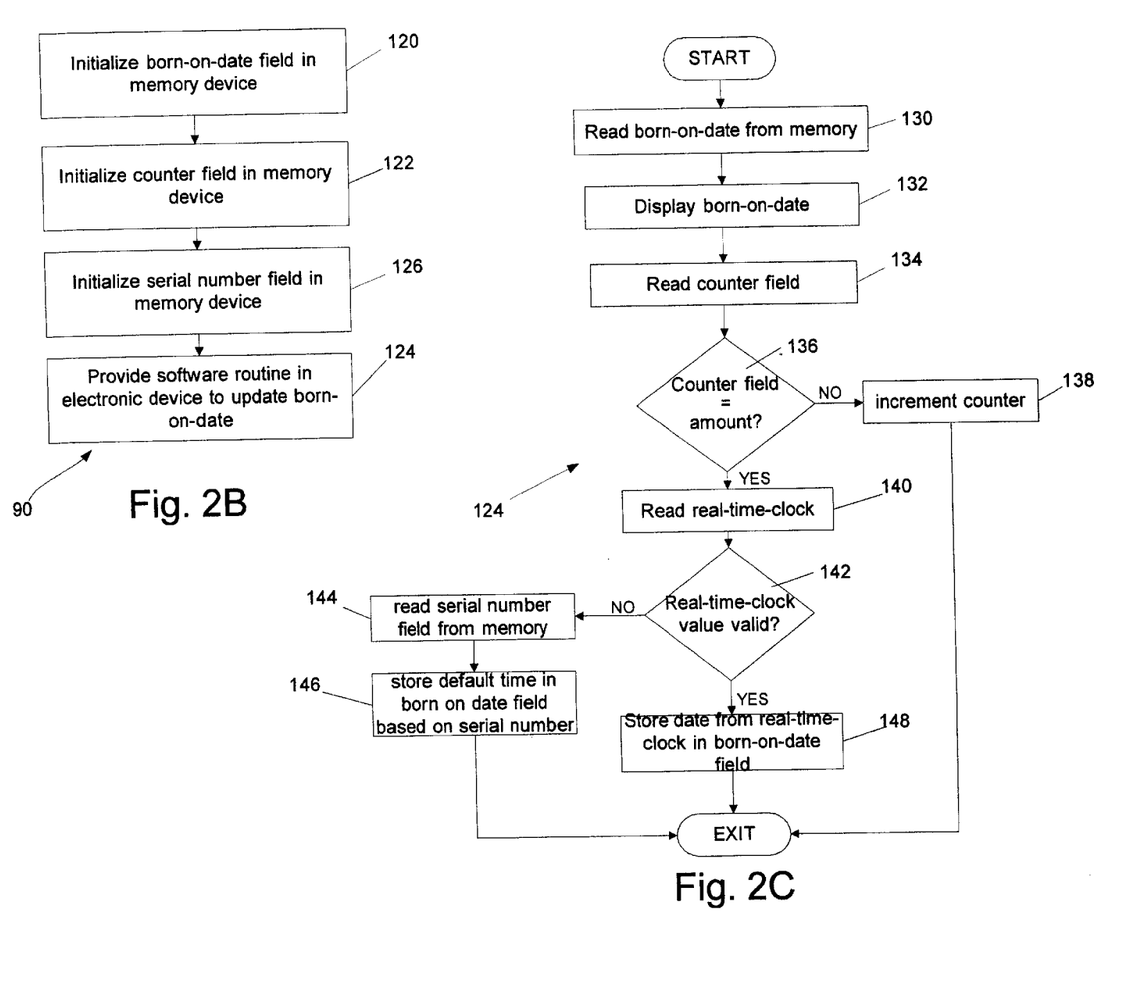
FIG. 2B is an exemplary flow chart of a process to ensure a warranty start date.
FIG. 2C is an exemplary flow chart of block 124 in FIG. 2B.

FIG. 2B is an exemplary flowchart of a method of creating the BOD by a manufacturer for the portable computer 10 of FIG. 1A or other electronic device. In block 120, when the device is manufactured, a BOD field 76 in a memory device is initialized. A special value may be used to indicate that the product is still in the manufacturing process and therefore notify the BIOS to not set the BOD no matter how often the device is restarted. Another value may be used to indicate that the manufacturing steps are complete and that the BOD field 76 may be updated based on the counter field 78 value. In block 122, a counter field 78 in the nv-memory is initialized. Again special values may optionally and alternatively be used in the counter field 78 to indicate manufacturing status of the device. In block 126, the manufacturer initializes a serial number field in the memory device corresponding to the electronic device's manufacturing date. Preferably, the maximum pre-determined number of events such as restarts used in the counter field is five for a portable computer but any pre-determined number which allows for some demonstration by sales agents and/or configuration of the devices with preloaded software would meet the spirit and scope of the invention. Because electronic devices, especially computers, are restarted and rebooted many times, the counter field 78 is preferably stopped from incrementing after the pre-determined value has been reached to restrict the amount of memory required to implement the counter field. Next in block 124, the manufacturer provides a software routine, preferably in the BIOS of the electronic device to update and display the BOD field 76.

FIG. 2C is a block diagram of the exemplary software routine in block 124. In block 130, the BOD field 76 is read from the nv-memory. Then in block 132, the BOD field 76 is shown on the display of the electronic device. In block 134, the counter field 78 is read from the nv-memory. A decision is performed in block 136 on whether the counter field 78 contains the pre-determined value. If not, then in block 138 the counter is incremented and the routine exited. If the counter field 78 contains the pre-determined value, the RTC is read in block 140 and its date field examined for validity in block 142. If the RTC value is valid, then the read date is preferably encoded or formatted to be stored in the BOD field 76 in block 148, thus estimating the start of the warranty period. If in block 142, the RTC date was invalid, then in this exemplary embodiment in block 144, a serial number field from the nv-memory is read to recover the approximate date of manufacture, which is preferably incorporated into the serial number. Then in block 146, after formatting, the manufacturing or other default date is stored in the BOD field 76 to estimate the start of warranty period (proof of purchase) before the routine exits.

Figure 3:
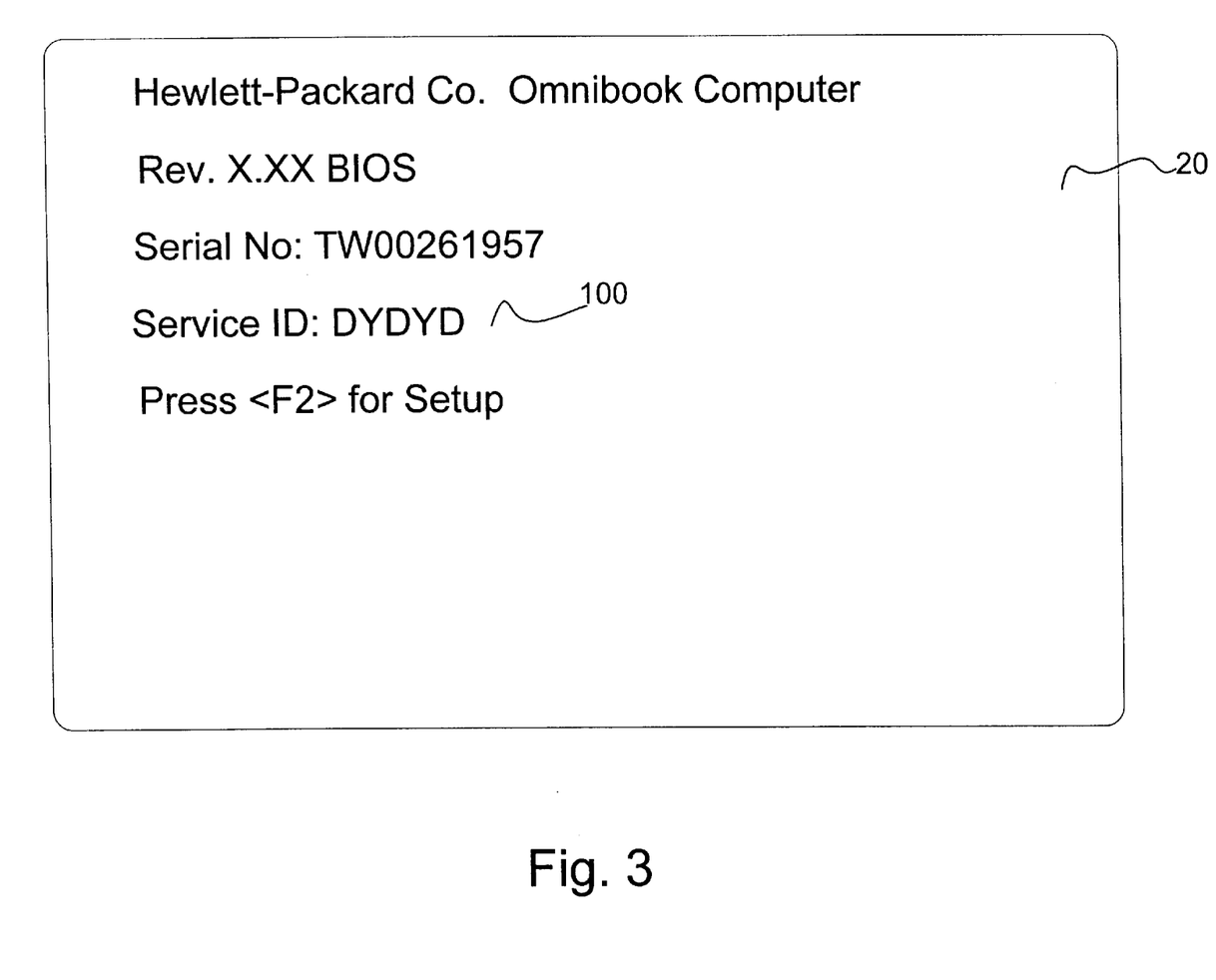
FIG. 3 is an exemplary screen shot of a boot sequence for the portable computer of FIG. 1A that displays a service ID.

FIG. 3 illustrates an exemplary screen shot of a portable computer 10 during the POST boot up process that displays the service ID 100, which preferably is an encoded version of the BOD. When the BOD is displayed as the service ID 100 on the display, preferably the value shown will not in an obvious way indicate that this number is a date. When the service ID 100 is read or given to the service agent, the service agent has a utility that deciphers the service ID 100 to recover the BOD. The service agent can also use the specified serial number, if it has been encoded to include the date of manufacture, as a gross check of the accuracy of the BOD to ensure that the BOD has not been tampered with, misread, or misreported. Of course, in the event that the unit was demo'ed or previously operated by sales people or others, the customer can always present receipts or other proof-of-purchase date items to refute the BOD given by the electronic device.

Figure 4A:
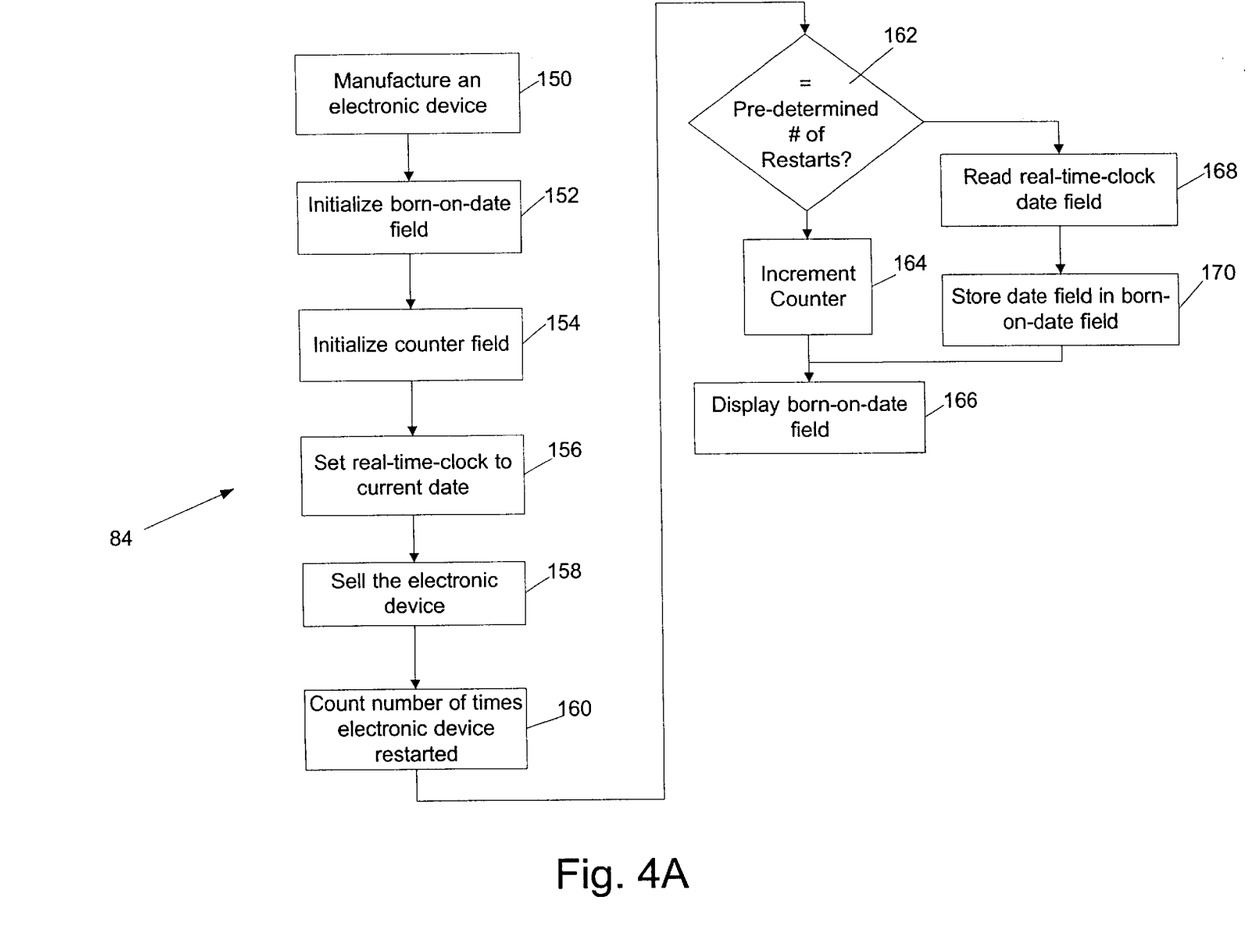
FIG. 4A is an exemplary flow chart of an alternative embodiment of the invention.

FIG. 4A is an exemplary flow chart of a process 84 for ensuring a warranty proof of purchase date by a manufacturer. In block 150, an electronic device is manufactured and includes a RTC and nv-memory circuit that contains a BOD field 76 and a counter field 78. When the device is manufactured, the BOD and counter fields are initialized to pre-determined values in block 152 and 154, respectively. The RTC in block 156 is set to the current date. The manufacturer then sells the electronic device in block 158 with a routine to update the BOD. The electronic device then counts the number of times that it is restarted in block 160. After a pre-determined number of restarts is detected, in block 162, the RTC date field is read in block 168 and stored in the BOD field 76 in block 170. If in block 162, the pre-determined number of restarts has not been detected, then the counter field 78 is incremented in block 164. Finally in block 166, the contents of the born-on-date is preferably encoded and displayed on the display of the electronic device when restarted. Alternatively, auxiliary programs such as diagnostic routines can access the BOD either by the user of the device or by remotely using remote diagnostic software such as Hewlett-Packard Top Tools utilities.

Figure 4B:
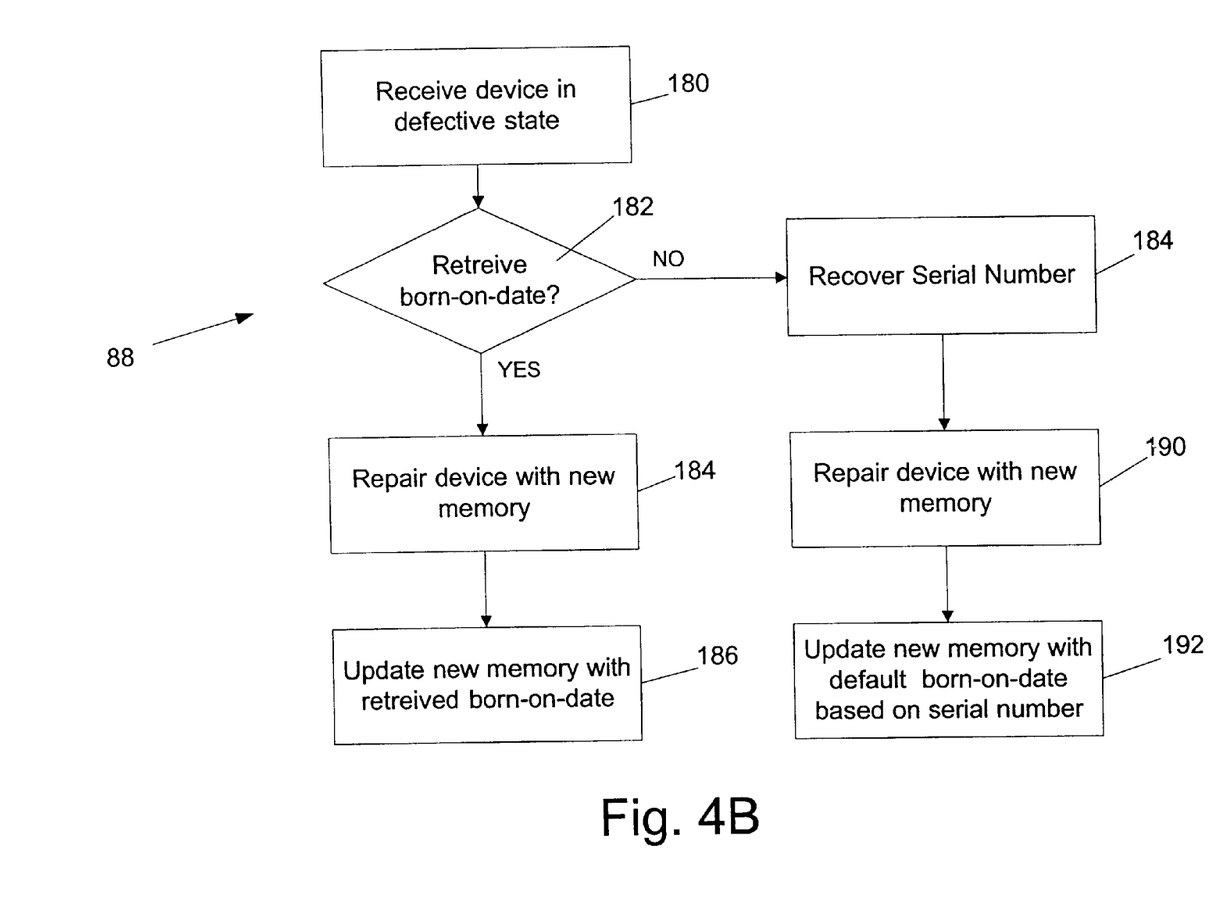
FIG. 4B is an exemplary flow chart of another aspect of the invention continuing from the flow chart in FIG. 5A.

Because electronic devices sometimes fail in a manner in which the display is not operating properly, FIG. 4B illustrates additional steps 88 when optionally may be used to ensure a warranty proof of purchase date. In block 180, the electronic device is received by a repair service of the manufacturer or other authorized party in a defective state. Depending on how the electronic device is constructed, multiple methods of retrieving the BOD can be used and are know to those skilled in the art. If in block 182, the BOD is retrieved from nv-memory then in block 184 the electronic device is repaired to a non-defective state in which the nv-memory is replaced with a new nv-memory circuit, such as with a board or circuit swap. Then in block 186, the new nv-memory is updated with the original retrieved BOD. If in block 182, the BOD could not be recovered, then the serial number is recovered by either reading it from nv-memory, if possible, or from optionally a label affixed to the product. The electronic device is then repaired with a new nv-memory circuit in block 190. Then in block 192, the new nv-memory circuit is updated with a default BOD based on the contents of the serial number plus preferably a reasonable inventory shelf time such as 3 months, for example.

Although several embodiments have been shown, illustrated and described, those skilled in the art will appreciate that several modifications can be made and still fall within the spirit and scope of the invention. Accordingly, the invention is only limited by the following claims.

What is claimed is:

1. An electronic device, comprising:
   a central processing unit (CPU);
   a real-time clock circuit coupled to said CPU;
   a display coupled to said CPU;
   a memory device coupled to said CPU, said memory device including a data structure including,
      a born-on-date (BOD) field containing a warranty start date for the electronic device,
      a counter field; and
   computer executable code for the CPU for reading the real-time clock circuit, updating the BOD field based on the contents of said counter field, and displaying the BOD field on said display.

2. The electronic device of claim 1 wherein said counter field is initialized when said electronic device is manufactured and wherein said computer executable code increments said counter field up to a predetermined amount when said electronic device is restarted.

3. The electronic device of claim 2 wherein said predetermined amount is 5.

4. The electronic device of claim 1 wherein said BOD is displayed on said display in an encoded manner.

5. The electronic device of claim 1 wherein said memory device is non-volatile.

6. The electronic device of claim 5, wherein said memory device is an electrically erasable programmable read only memory (EEPROM).

7. The electronic device of claim 5 wherein said memory device is a flash memory.

8. A method of creating a warranty start date for an electronic device, comprising the steps of:
   initializing a born-on-date (BOD) field in a memory device within the electronic device when the electronic device is manufactured;
   initializing a counter field in the memory device when the electronic device is manufactured; and
   providing a software routine with the electronic device capable of performing the following steps of,
      reading the BOD field;
      displaying the BOD field;
      reading the counter field; and
      updating the BOD field from the contents of a real-time-clock based on the contents of the counter field.

9. An electronic device including a warranty based on a BOD created by the method of claim 8.

10. A method of displaying a service ID on a display of an electronic device, comprising the steps of:
    reading a born-on-date (BOD) field from a memory device within the electronic device;
    displaying the BOD field in an encoded manner onto the display;
    reading a counter field from the memory device, wherein the counter field is a record of the number of times an event occurs, up to a predetermined amount;
    if the counter field equals the predetermined amount then, reading the contents of a real-time-clock (RTC) within the electronic device, and
       storing the contents of the RTC in the BOD field;
    else incrementing the counter field.

11. The method of claim 10 wherein the event is the restarting of the electronic device since being manufactured.

12. The method of claim 10, further comprising the steps of:
    verifying that the contents of the RTC is valid before storing the contents of the RTC in the BOD field; and if not valid,
reading a serial number field from the non-volatile memory device, and storing a default time in the BOD field based on information on the contents of the serial number.

13. An electronic device comprising computer executable code implementing the method of claim 10.

14. A computer readable memory capable of directing program steps accessible by a central processing unit on an electrical device, the computer readable memory organized to perform the method of claim 10.

15. The computer readable memory of claim 14, wherein said computer readable memory is a basic input output system (bios) program.

16. A method of estimating a warranty start date, comprising the steps of:
manufacturing an electronic device having a memory circuit containing a born-on-date field and a counter field;
initializing the born-on-date field;
initializing the counter field;
setting the real-time-clock on the electronic device to a current date;
selling the electronic device;
counting the number of times an event on the electronic device occurs;
after a predetermined number of events occur,
reading the real-time-clock to retrieve the present date, storing the present date in the born-on date field; and
displaying the born-on-date on a display of the electronic device when the electronic device is restarted.

17. The method of claim 16, further including the steps of:
receiving the electronic device in a defective state;
retrieving the born-on-date from the memory circuit;
repairing the electronic device to a non-defective state during which the memory circuit is replaced with a new memory circuit; and
updating the new memory circuit with the retrieved born-on-date.

18. The method of claim 16, further including the steps of:
receiving the electronic device in a defective state;
reading the serial number of the electronic device;
repairing the electronic device to a non-defective state during which the memory circuit is replaced with a new memory circuit; and
updating the new memory circuit with a default born-on-date based on the contents of the read serial number.

19. The method of claim 16 wherein the step of counting the number of times an event on the electronic device occurs includes the step of counting the number of restarts.

20. An electronic device including a warranty based on a warranty start date using the method of claim 16.

* * * * *